(12) United States Patent
 Chen et al.

(10) Patent No.: US 10,665,746 B1
(45) Date of Patent: May 26, 2020

(54) MANUFACTURING METHOD OF LIGHT-EMITTING DEVICE

(71) Applicant: Au Optronics Corporation, Hsinchu (TW)

(72) Inventors: Yung-Chih Chen, Taichung (TW); Tsung-Ying Ke, Tainan (TW); Li-Chih Hsu, Taipei (TW); Keh-Long Hwu, Hsinchu County (TW); Wan-Tsang Wang, Hsinchu (TW); Chun-Hsin Liu, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/430,443

(22) Filed: Jun. 4, 2019

(30) Foreign Application Priority Data

Dec. 11, 2018 (TW) .............................. 107144639 A (51) Int. Cl.
 *H01L 21/66* (2006.01)
 *H01L 33/00* (2010.01)
(52) U.S. Cl.
 CPC ............ *H01L 33/005* (2013.01); *H01L 22/32* (2013.01); *H01L 2933/005* (2013.01)
(58) Field of Classification Search
 None
 See application file for complete search history.

(56) References Cited

U.S. PATENT DOCUMENTS

| | | | | |
|---|---|---|---|---|
| 10,134,646 | B2* | 11/2018 | Byun | .................. H01L 51/0031 |
| 10,269,779 | B2 | 4/2019 | Lu | |
| 10,453,759 | B2* | 10/2019 | Iguchi | .................... G09G 3/006 |
| 2015/0270250 | A1* | 9/2015 | Takamitsu | ............... G11C 5/00 257/48 |
| 2018/0342492 | A1 | 11/2018 | Lu | |

FOREIGN PATENT DOCUMENTS

| | | |
|---|---|---|
| CN | 106373895 | 2/2017 |
| CN | 107170773 | 9/2017 |
| CN | 108417682 | 8/2018 |
| TW | 201810709 | 3/2018 |

\* cited by examiner

*Primary Examiner* — Angel Roman
(74) *Attorney, Agent, or Firm* — JCIPRNET (57) ABSTRACT

A manufacturing method of a light-emitting device including the following steps is provided. A test trace and a first signal trace are formed on a first substrate. A light-emitting element electrically connected to the test trace and the first signal trace is formed. A test procedure is performed on the light-emitting element via the test trace and the first signal trace. An encapsulation layer is formed on the first substrate to cover the light-emitting element. The test trace is removed, and then a driving unit electrically connected to light-emitting element is formed.

12 Claims, 10 Drawing Sheets

MANUFACTURING METHOD OF LIGHT-EMITTING DEVICE

CROSS REFERENCE TO RELATED APPLICATION

This application claims the priority benefit of Taiwan application serial no. 107144639, filed on Dec. 11, 2018. The entirety of the above-mentioned patent application is hereby incorporated by reference herein and made a part of specification.

BACKGROUND

Technical Field

The present invention is related to a manufacturing method of a light-emitting device, and more particularly, to a manufacturing method of a light-emitting device having a light-emitting diode element.

Description of Related Art

At present, in the manufacturing process of display devices, a mass transfer technique is often used. The mass transfer technique is used to transfer a large number of light-emitting elements (e.g., light-emitting diodes) onto a circuit substrate, and then electrically connect the light-emitting elements to pixel circuits on the circuit substrate. However, in the current technology, because there is a concern that the circuit board may be damaged in the repair procedure, after a large number of light-emitting elements are transferred onto the circuit board, it is difficult to repair the light-emitting element that is defective and cannot operate normally. Therefore, it is necessary to discard the defective device, so that the yield production is insufficient.

SUMMARY

An embodiment of the present invention provides a manufacturing method of a light-emitting device that can improve the yield production of the light-emitting device.

A manufacturing method of a light-emitting device according to an embodiment of the present invention includes the following steps. A test trace and a first signal trace are formed on a first substrate. A light-emitting element electrically connected to the test trace and the first signal trace is formed. A test procedure is performed on the light-emitting element via the test trace and the first signal trace. An encapsulation layer is formed on the first substrate to cover the light-emitting element. After the test trace is removed, a driving unit electrically connected to the light-emitting element is formed.

Based on the above, the manufacturing method of the light-emitting device of the present invention comprises the following steps of: forming the test trace and the first signal trace on the first substrate; forming the light-emitting element electrically connected to the test trace and the first signal trace; performing the test procedure on the light-emitting element via the test trace and the first signal trace; forming the encapsulation layer to cover the light-emitting element; and removing the test trace to then form the driving unit electrically connected to the light-emitting element, thereby in the case where the driving unit is avoided from being damaged due to the repair procedure, it is possible to perform the repair procedure on the light-emitting element that has been found to be abnormal after the test procedure is executed, so that the goal of improving the yield production of the light-emitting device is achieved.

To make the above features and advantages of the present invention more comprehensible, several embodiments accompanied with figures are described in detail as follows.

DESCRIPTION OF THE EMBODIMENTS

The term "about," "approximately," "essentially" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on measurement properties, cutting properties or other properties, instead of applying one standard deviation across all the properties.

In the figures, the thicknesses of, for instance, layers, films, panels, and regions are enlarged for clarity. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Therefore, the "electrical connection" may be refer an intervening elements exist between two elements.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
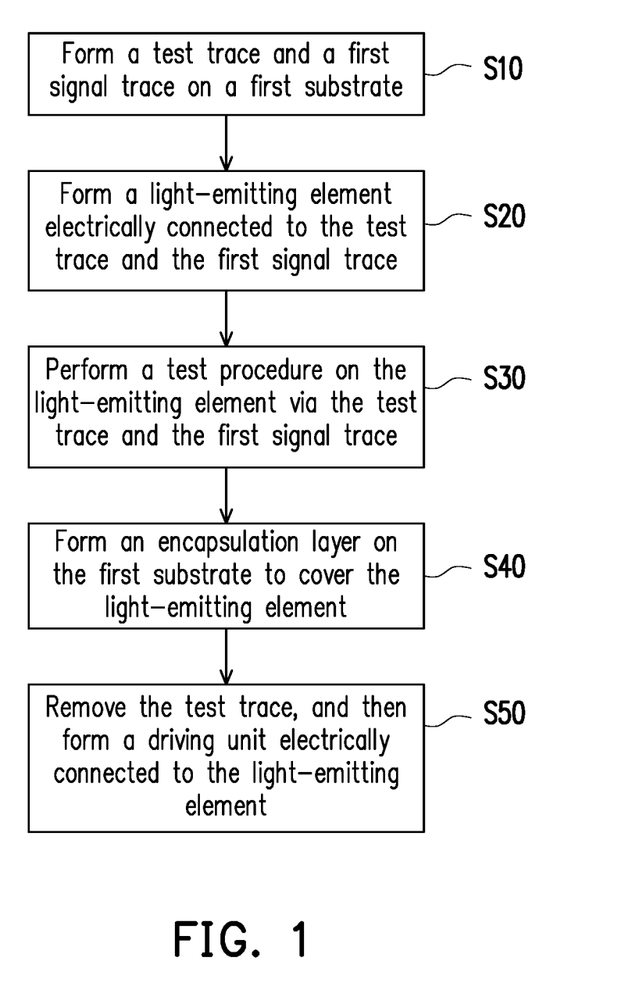
FIG. 1 is a flow chart of a manufacturing method of a light-emitting device in accordance with an embodiment of the present invention.

FIG. 1 is a flow chart of a manufacturing method of a light-emitting device in accordance with an embodiment of the present invention. Referring to FIG. 1, the manufacturing method of the light-emitting device may include the steps of: forming a test trace and a first signal trace on a first substrate (step S10); forming a light-emitting element electrically connected to the test trace and the first signal trace (step S20); performing a test procedure on the light-emitting element via the test trace and the first signal trace (step S30); forming an encapsulation layer on the first substrate to cover the light-emitting element (step S40); and removing the test trace to then form a driving unit electrically connected to the light-emitting element (step S50).

It should be noted that the present invention does not limit the number of the test trace, the first signal trace, the light-emitting element, the encapsulation layer, and the driving unit in the above step S10 to step S50. That is, in the above step S10, one or more test traces and one or more first signal traces may be formed. In the above step S20, one or more light-emitting elements may be formed. In the above step S40, one or more encapsulation layers may be formed. In the above step S50, one or more driving units may be formed. Hereinafter, a manufacturing method of a light-emitting device according to an embodiment of the present invention will be specifically described with reference to FIG. 2A to FIG. 2D and FIG. 3A to FIG. 3E.

FIG. 2A to FIG. 2D are schematic top views of a light-emitting device at various stages in a manufacturing process in accordance with an embodiment of the present invention. FIG. 3A to FIG. 3E are schematic cross-sectional views of a light-emitting device at various stages in a manufacturing process in accordance with an embodiment of the present invention. The cross-sectional position of FIG. 3A may correspond to the position of the sectional line I-I' of FIG. 2A, the cross-sectional positions of FIG. 3B and FIG. 3C may correspond to the position of the sectional line II-IF of FIG. 2B, the cross-sectional position of FIG. 3D may correspond to the position of the sectional line III-III' of FIG. 2C and the cross-section position of FIG. 3E may correspond to the position of the sectional line IV-IV' of FIG. 2D. For convenience of description, some of the film layers are omitted in FIG. 2A to FIG. 2D to clearly show the arrangement relationship between the components.

Figure 2A:
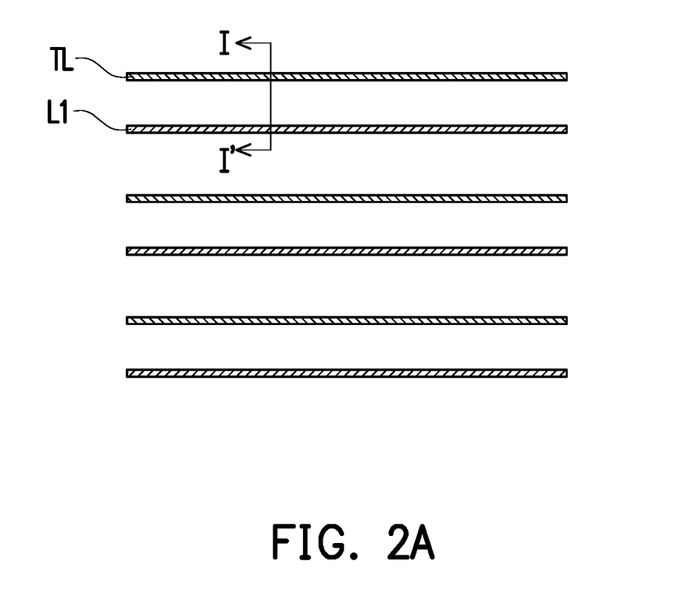
FIG. 2A to FIG. 2D are schematic top views of a light-emitting device at various stages in a manufacturing process in accordance with an embodiment of the present invention.
Figure 3A:
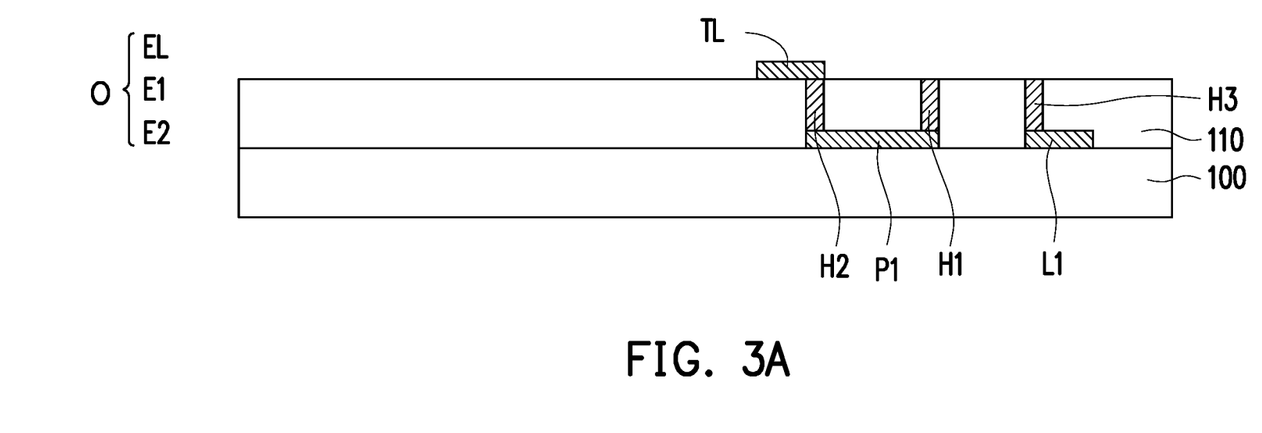
FIG. 3A to FIG. 3E are schematic cross-sectional views of a light-emitting device at various stages in a manufacturing process in accordance with an embodiment of the present invention.

Referring to FIG. 2A and FIG. 3A, first, a plurality of first signal traces L1 and a plurality of first conductive patterns P1 are formed on a first substrate 100. The material of the first substrate 100 may be glass, quartz or an organic polymer. Based on the conductivity considerations, the first signal trace L1 and the first conductive pattern P1 are generally a metal material. However, the present invention is not limited thereto. According to other embodiments, the first signal trace L1 and the first conductive pattern P1 may be, for example, an alloy, a nitride of a metal material, an oxide of a metal material, an oxynitride of a metal material, a non-metallic material with conductive property or other suitable materials. In this embodiment, the first signal trace L1 and the first conductive pattern P1 may be a single-layer structure or a multilayer structure, respectively. In addition, in the embodiment, the first signal trace L1 and the first conductive pattern P1 may be formed in the same process step, whereby the first signal trace L1 and the first conductive pattern P1 be made of the same material. However, the invention is not limited thereto. In other embodiments, the first signal trace L1 and the first conductive pattern P1 may be formed in different process steps. In this case, the material of the first signal trace L1 may be different from the material of the first conductive pattern P1.

Next, an insulating layer 110 is formed on the first substrate 100. In this embodiment, the material of the insulating layer 110 may be an inorganic material, an organic material, or other suitable materials. The inorganic material is, for example, silicon oxide, silicon nitride, silicon oxynitride, or other suitable materials. The organic material is, for example, a polyimide resin, an epoxy resin, an acrylic resin, or other suitable materials. In the present embodiment, the insulating layer 110 may be a single-layer structure or a multilayer structure. In addition, in the present embodiment, the method of forming the insulating layer 110 may include a physical vapor deposition method or a chemical vapor deposition method.

Then, a plurality of first contact windows H1, a plurality of second contact windows H2, and a plurality of third contact windows H3 are formed on the first signal traces L1 and the first conductive patterns P1, and a plurality of test traces TL are formed on the plurality of second contact windows H2. In detail, in the embodiment, the method for forming the test traces TL, the first contact windows H1, the second contact windows H2, and the third contact windows H3 may include the following steps. After a patterning process is executed on the insulating layer 110 to form a plurality of openings (not shown), a conductive material (not shown) is formed on the insulating layer 110 and filled in the openings. Next, the conductive material on the insulating layer 110 is patterned to form the first contact windows H1, the second contact windows H2, the third contact windows H3, and the test traces TL. In the present embodiment, the conductive materials of the test trace TL, the first contact window H1, the second contact window H2, and the third contact window H3 may be made of the same material, thereby the conductive materials of the test trace TL, the first contact window H1, the second contact window H2 and the third contact window H3 may be formed in the same process step. However, the invention is not limited thereto. In other embodiments, the test trace TL may be formed in a process step different from that for forming the first contact window H1, the second contact window H2 and the third contact window H3. In this case, the conductive material of the test trace TL may be different from the conductive materials of the first contact window H1, the second contact window H2, and the third contact window H3.

Based on the conductivity considerations, the conductive materials of the test trace TL, the first contact window H1, the second contact window H2, and the third contact window H3 respectively are generally a metal material. However, the present invention is not limited thereto. According to other embodiments, the conductive materials of the test trace TL, the first contact window H1, the second contact window H2, and the third contact window H3 may respectively be, for example, an alloy, a nitride of a metal material, an oxide of a metal material, an oxynitride of a metal material, a non-metallic material having conductive property, or other suitable materials.

As shown in FIG. 3A, in the embodiment, one third contact window H3 is directly connected to one first signal trace L1, and one first contact window H1 and one second contact window H2 are directly connected to the same first conductive pattern P1, and one second contact window H2 is directly connected to one test trace TL. Since the partial cross-sectional structure corresponding to the sectional line I-I' is disclosed in FIG. 3A, the arrangement relationship between the first signal traces L1, the first conductive patterns P1, the test traces TL, the first contact windows H1, the second contact windows H2 and the third contact windows H3 is not limited to that depicted in FIG. 3A. According to the following description, any one of ordinary skill in the art should understand that one first signal trace L1 is directly connected to a plurality of third contact windows H3, and one test trace TL is directly connected to a plurality of second contact windows H2, and one test trace TL is electrically connected to a plurality of first conductive patterns P1.

In addition, as shown in FIG. 2A, in the present embodiment, the test trace TL and the first signal trace L1 are parallel to each other. However, the invention is not limited thereto. In other embodiments, the extending direction of the test trace TL may intersect with the extending direction of the first signal trace L1.

Figure 2B:
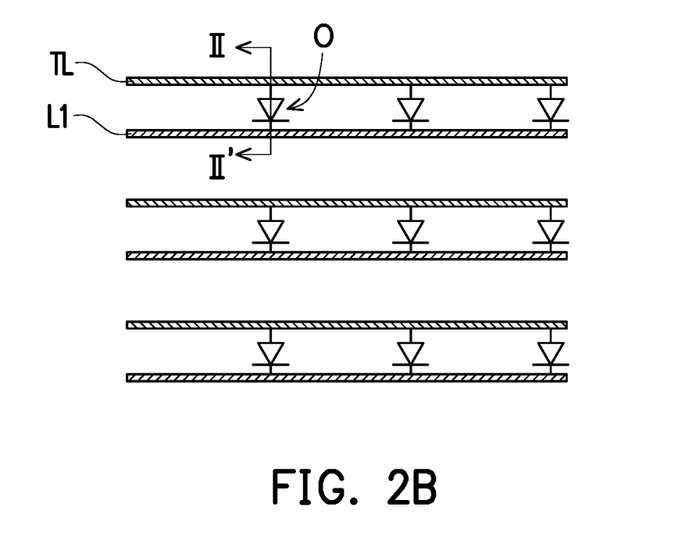
Figure 3B:
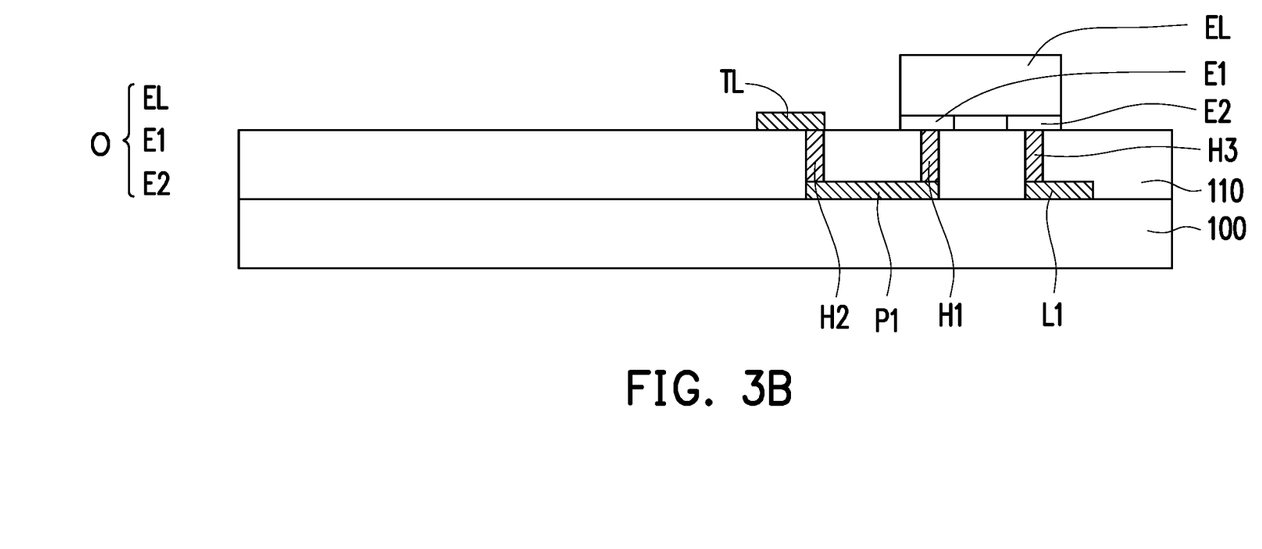

Next, referring to FIG. 2B and FIG. 3B, a plurality of light-emitting elements O are formed on the first substrate 100. In the present embodiment, the plurality of light-emitting elements O may be formed on the first substrate 100 by using any transfer technique well known to those of ordinary skill in the art. In this embodiment, the light-emitting element O may be, for example, an organic light emitting diode (OLED), a micro-light emitting diode (micro-LED), a mini-light emitting diode (mini-LED), a quantum dot-light emitting diode (Quantum dot-LED, QD-LED) or other sizes of light-emitting diodes, but the invention is not limited thereto. Further, in the present embodiment, the plurality of light-emitting elements O may include a combination of red light-emitting elements, green light-emitting elements, and blue light-emitting elements. However, the present invention does not limit the color combination of the plurality of light-emitting elements O, depending on the needs of the designer.

In the present embodiment, each of the light-emitting elements O includes a first electrode E1, a second electrode E2, and a light-emitting structure EL, and the light-emitting structure EL is electrically connected to the first electrode E1 and the second electrode E2. In the present embodiment, the light emitting structure EL may include an organic material (for example, an organic polymer luminescent material, an organic small molecule luminescent material, an organic complex luminescent material, other suitable materials, or a combination of the foregoing materials), an inorganic material (for example: a perovskite material, a rare earth ion luminescent material, a rare earth fluorescent material, a semiconductor luminescent material, other suitable materials or combinations of the foregoing), other suitable materials or combinations of the foregoing. In this embodiment, the material of the first electrode E1 and the second electrode E2 may include an organic conductive material, a metal, a metal oxide or an alloy. The method of forming the first electrode E1 and the second electrode E2 may include, for example, a physical vapor deposition method, a chemical vapor deposition method, a thermal evaporation method, or other suitable methods, and the invention is not limited thereto.

As shown in FIG. 3B, in the present embodiment, the first electrode E1 is electrically connected to the test trace TL via the second contact window H2, the first conductive pattern P1 and the first contact window H1, and the second electrode E2 is electrically connected to the first signal trace L via the third contact window H3. That is to say, in the present embodiment, one light-emitting element O is electrically connected to one test trace TL and one first signal trace L1. In other words, in the present embodiment, the test trace TL and the first signal trace L1 corresponding to one light-emitting element O may be used as the anode end and the cathode end of the light-emitting element O, respectively. Although FIG. 3B discloses only a partial cross-sectional structure corresponding to the sectional line II-IF (corresponding to one light-emitting element O), according to the disclosure of FIG. 2B and FIG. 3B, those of ordinary skill in the art should understand that one test trace TL may be electrically connected to a plurality of light-emitting elements O via a plurality of second contact windows H2, a plurality of first conductive patterns P1 and a plurality of first contact windows H1, and one first signal trace L1 may be electrically connected to a plurality of light-emitting elements O via a plurality of third contact windows H3.

After forming the light-emitting elements O on the first substrate 100, a test procedure is performed on the light-emitting elements O to determine whether the light-emitting elements O are defective and cannot operate normally. As described above, the test trace TL and the first signal trace L1 may be used as the anode end and the cathode end of the light-emitting element O, respectively, and thus via the test trace TL and the first signal trace L1 to enable the light-emitting element O, the test procedure is executed on the light-emitting element O to confirm whether the light-emitting element O is abnormal. For example, when the following occurs, the light-emitting element O can be judged as abnormal: when the light-emitting element O fails to properly align with the first contact window H1 and the third contact window H3, the light-emitting element O cannot be electrically connected to the test trace TL and the first signal line L1 correctly, so that when via the test trace TL and the first signal trace L1 to enable the light-emitting element O, the light-emitting element O cannot be lighted. Therefore, in the present embodiment, the test procedure may be, for example, a light-on test. Further, after the test procedure is executed, if the tested light-emitting element O is abnormal and cannot be lighted, the existing defect can be repaired by replacing the new light-emitting element O and performing the test procedure again.

Figure 3C:
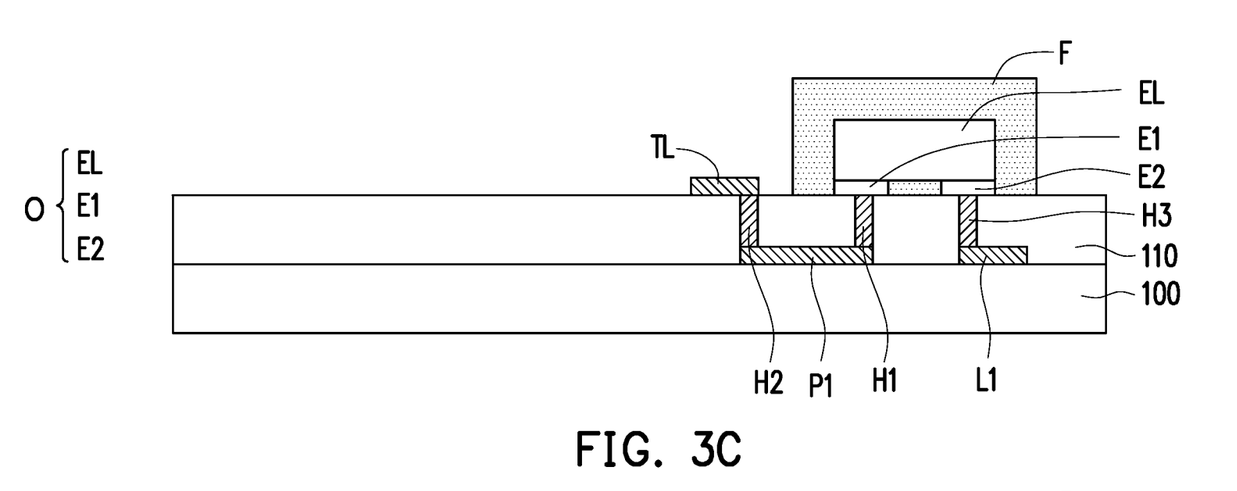

Next, referring to FIG. 2B and FIG. 3C, after ensuring that the light-emitting elements O formed on the first substrate 100 can operate normally, a plurality of encapsulation layers F are formed on the first substrate 100 to cover the light-emitting elements O. Although FIG. 3C discloses only a partial cross-sectional structure corresponding to the sectional line II-II' (corresponding to one light-emitting element O), according to the disclosure of FIG. 2B and FIG. 3C, those of ordinary skill in the art should understand that each of the light-emitting elements O is covered by the encapsulation layer F. In this embodiment, the encapsulation layer F may be a single-layer structure or a multilayer structure, and the material of the encapsulation layer F may include silicon nitride, aluminum oxide, silicon carbonitride (SiCN), silicon oxynitride, acrylic resin, hexamethyl disiloxane (HMDSO) or glass, but the invention is not limited thereto.

Figure 2C:
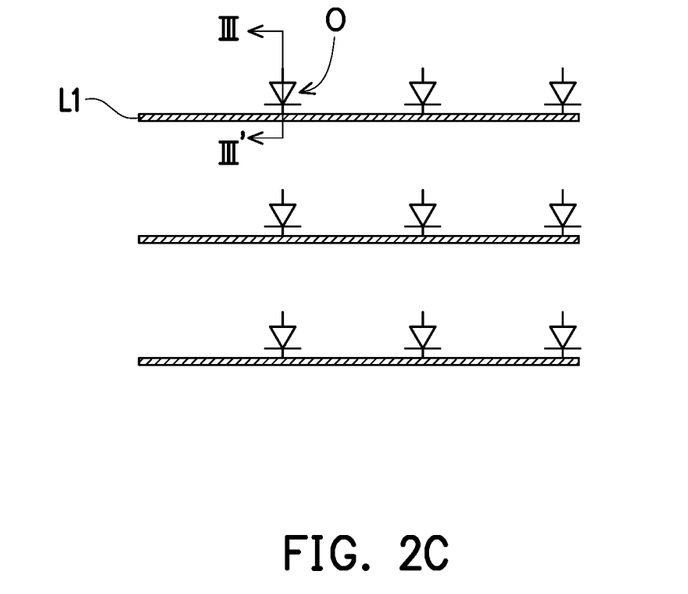
Figure 3D:
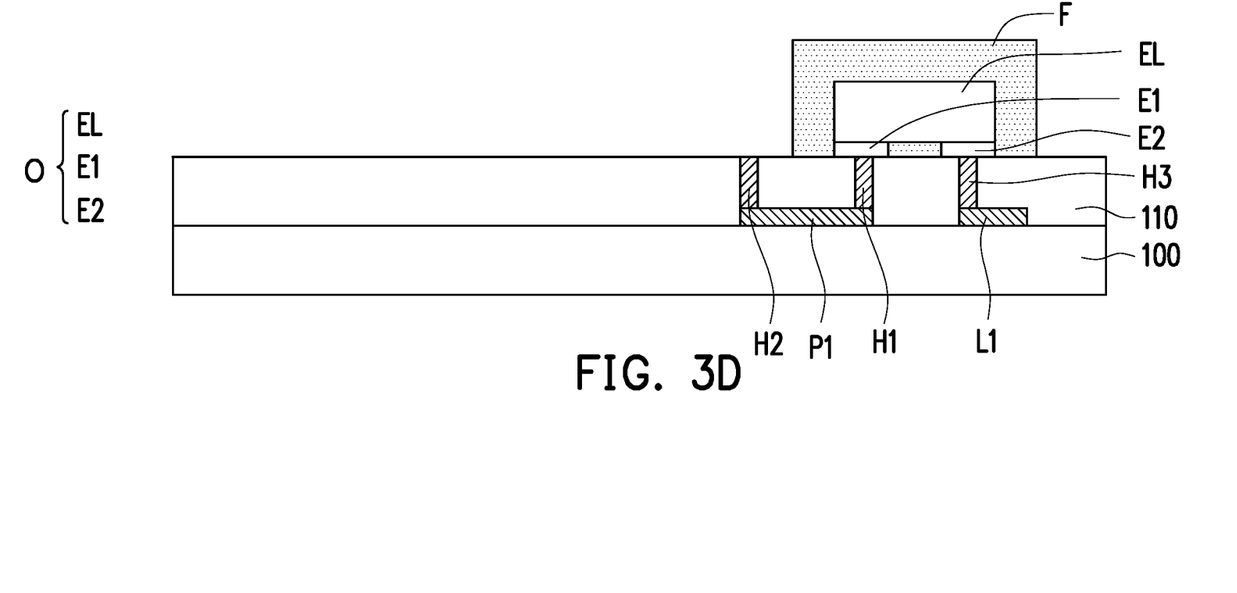

Next, referring to FIG. 2C and FIG. 3D, after the encapsulation layers F are formed, the test traces TL are removed. In the present embodiment, removing the test traces TL exposes the second contact windows H2, as shown in FIG. 3D. In the present embodiment, the method of removing the test trace TL may include an etch process. It is worth mentioning that since the test traces TL are removed after the encapsulation layers F are formed, the encapsulation layers F are used to protect the light-emitting elements O from moisture, impurities, etc., and to protect the light-emitting elements O from being damaged during the removal of the test traces TL.

Figure 2D:
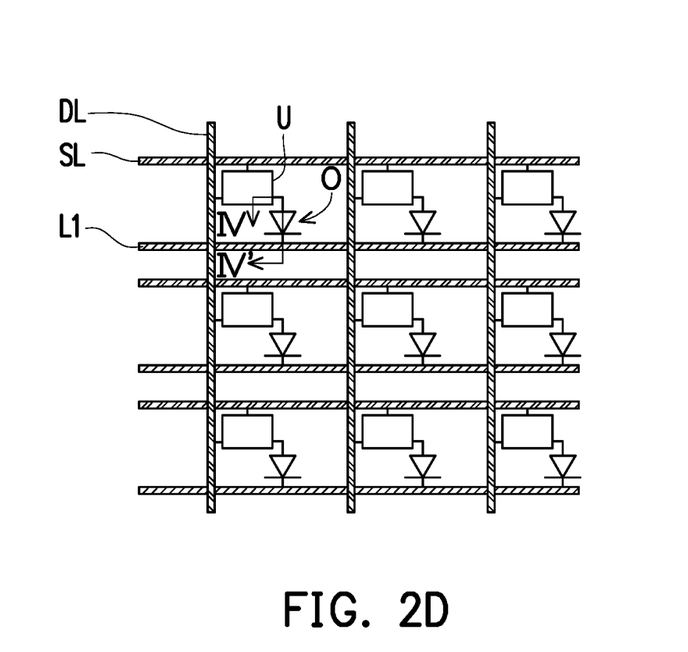
Figure 3E:
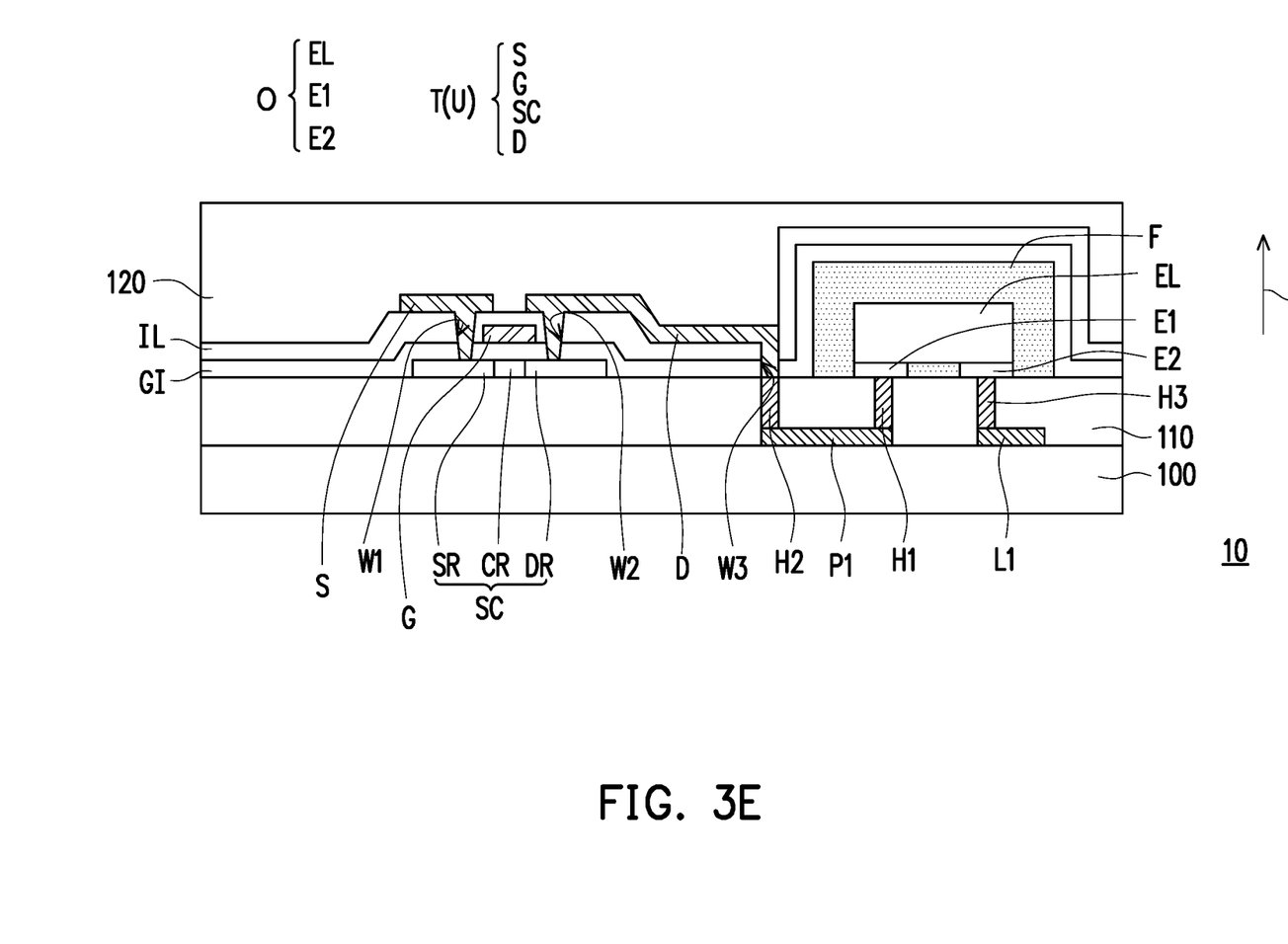

Next, referring to FIG. 2D and FIG. 3E, after the test traces TL are removed, a plurality of driving units U electrically connected to the light-emitting elements O are formed on the insulating layer 110. In detail, as shown in FIG. 2D, each of the light-emitting elements O is driven by one driving unit U. In the present embodiment, each driving unit U may include a driving element T, as shown in FIG. 3E. In the present embodiment, the method of forming the driving element T may include the steps of: sequentially forming a semiconductor layer SC, a gate insulating layer GI, a gate G, an interlayer insulating layer IL, a source S, and a drain D on the insulating layer 110. The semiconductor layer SC includes a source region SR, a drain region DR, and a channel region CR formed by performing an ion doping process with the gate G as a mask. The gate G and the channel region CR are overlapped with each other in the normal direction n of the first substrate 100. The source S is electrically connected to the source region SR via a contact opening W1 formed in the gate insulating layer GI and the interlayer insulating layer IL, and the drain D is electrically connected to the drain region DR via a contact opening W2 formed in the gate insulating layer GI and the interlayer insulating layer IL. However, the present invention is not limited thereto. In the present embodiment, the semiconductor layer SC, the gate insulating layer GI, the gate G, the interlayer insulating layer IL, the source S, and the drain D may each be implemented by any semiconductor layer, any gate insulating layer, any gate, any interlayer insulating layer, any source, and any drain used for a light-emitting device well known to those of ordinary skill in the art, so that the descriptions of the materials and the forming methods of the semiconductor layer SC, the gate insulating layer GI, the gate G, the interlayer insulating layer IL, the source S, and the drain D will not be described herein.

In the present embodiment, the driving element T may be any thin film transistor known to those of ordinary skill in the art, such as low temperature poly-silicon thin film transistor (LIPS TFT), amorphous silicon thin film transistor (a-Si TFT), micro crystalline silicon thin film transistor (micro-Si TFT) or metal oxide transistor. Further, in the present embodiment, the driving element T belongs to the top gate type thin film transistor, but the present invention is not limited thereto. In other embodiments, the driving element T may belong to a bottom gate type thin film transistor.

In the present embodiment, during the process of forming the gate G of each driving element T, the signal lines SL are formed, and during the process of forming the source S and the drain D of each driving element T, the signal lines DL are formed. In the present embodiment, the signal line SL is not parallel to the signal line DL, that is, the extending direction of the signal line SL intersects with the extending direction of the signal line DL, but the present invention is not limited thereto. Further, in the present embodiment, the signal line SL is used as a scan line, and the signal line DL is used as a data line, but the present invention is not limited thereto. In other embodiments, the signal line SL is used as the data line, and the signal line DL is used as the scan line. In this case, the signal line DL is formed during the same process as the gate G, and the signal line SL is formed during the same process as the source S and the drain D. Further, as shown in FIG. 2D, in the present embodiment, the signal line DL and the signal line SL are electrically connected to the light-emitting element O via the driving unit U.

In the present embodiment, as shown in FIG. 3E, the drain D of the driving element T is directly connected to the second contact window H2 via a contact opening W3 formed in the gate insulating layer GI and the interlayer insulating layer IL. In other words, in the present embodiment, the driving element T may be electrically connected to the light-emitting element O via the second contact window H2, the first conductive pattern P1, and the first contact window H1. Although FIG. 3E only shows one driving element T electrically connected to the light-emitting element O, it should be understood by those of ordinary skill in the art that the driving unit U for driving the light-emitting element O actually has, for example, a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. In addition, although FIG. 3E discloses only a partial cross-sectional structure corresponding to the sectional line IV-IV' (corresponding to one light-emitting element O), according to the disclosure of FIG. 2D and FIG. 3E, those of ordinary skill in the art should understand that each of the light-emitting elements O is electrically connected to the driving element T in one of the driving units U.

Referring again to FIG. 3E, an insulating layer 120 covering the driving element T and the light-emitting element O is formed on the insulating layer 110. In this embodiment, the material of the insulating layer 120 may be an inorganic material, an organic material, or other suitable materials. The inorganic material is, for example, silicon oxide, silicon nitride, silicon oxynitride, or other suitable materials. The organic material is, for example, a polyimide resin, an epoxy resin, an acrylic resin, or other suitable materials. In the present embodiment, the insulating layer 120 may be a single-layer structure or a multilayer structure. In addition, in the present embodiment, the method of forming the insulating layer 120 may include a physical vapor deposition method or a chemical vapor deposition method.

So far, the fabrication of the light-emitting device 10 of the present embodiment is substantially completed after the processes shown in FIG. 3A to FIG. 3E described above. It should be noted that the manufacturing method of the light-emitting device 10 includes the following steps of: forming a test trace TL and a first signal trace L1 on a first substrate 100 (step S10), forming a light-emitting element O electrically connected to the test trace TL and the first signal trace L1 (step S20), performing a test procedure on the light-emitting element O via the test trace TL and the first signal trace L1 (step S30) to form an encapsulation layer F covering the light-emitting element O (step S40), and removing the test trace TL to then form a driving unit U electrically connected to the light-emitting element O (step S50), so the test procedure for confirming whether the light-emitting element O operates normally can be executed after forming the light-emitting element O and before forming the driving unit U. In this way, in the process of manufacturing the light-emitting device 10, the problem that the driving unit U is damaged during the repair procedure is eliminated, whereby the light-emitting device O having abnormality can be repaired after the test procedure is executed, and the goal of improving the yield production of the light-emitting device 10 is achieved. On the other hand, in the manufacturing method of the light-emitting device 10, since the step of forming the light-emitting element O is before the step of forming the driving unit U, the limits of the driving unit U to the environmental conditions such as temperature may not be considered in the process of forming the light-emitting element O (for example, the transfer process).

In the light-emitting device 10, the driving unit U and the light-emitting element O are located on the same side of the insulating layer 110, but the present invention is not limited thereto. Hereinafter, other embodiments will be described with reference to FIG. 4A to FIG. 4D. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

FIG. 4A to FIG. 4D are schematic cross-sectional views of a light-emitting device at various stages in a manufacturing process in accordance with an embodiment of the present invention. The cross-sectional position of FIG. 4A may correspond to the position of the sectional line III-III' of FIG. 2C, and the cross-sectional position of FIG. 4D may correspond to the position of the sectional line IV-IV' of FIG. 2D.

Figure 4A:
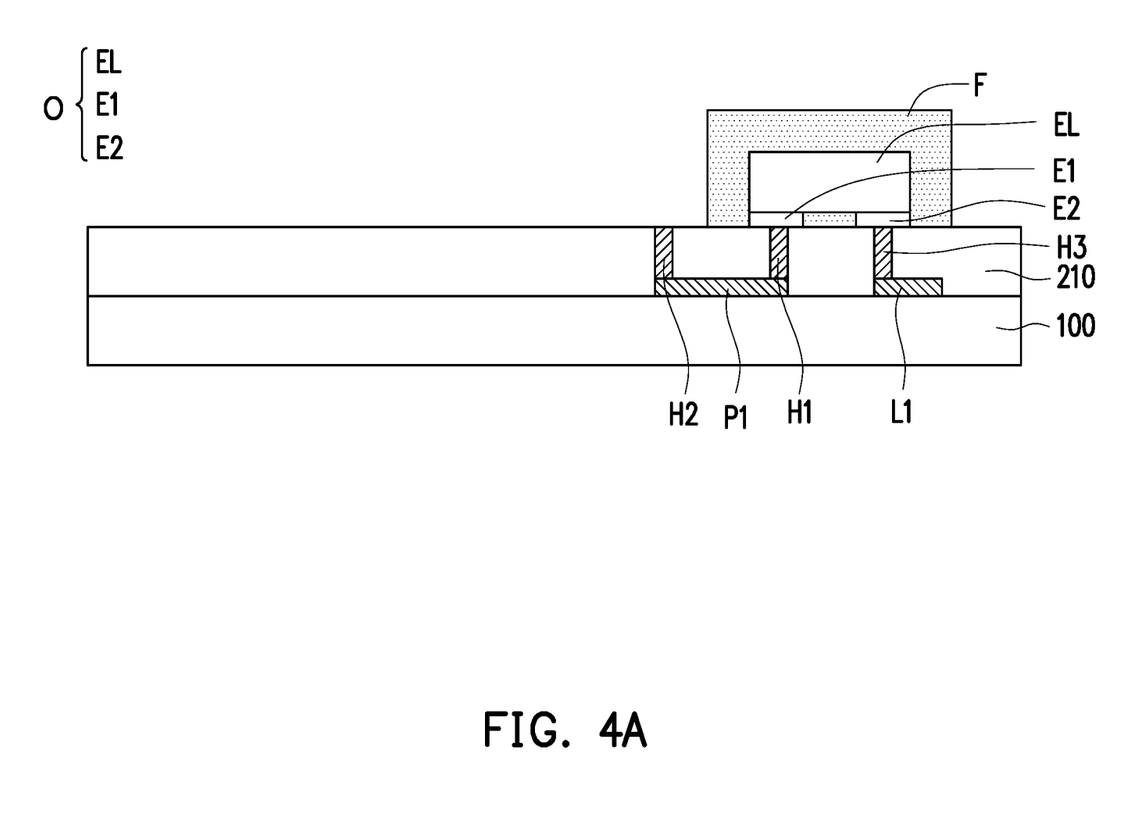
FIG. 4A to FIG. 4D are schematic cross-sectional views of a light-emitting device at various stages in a manufacturing process in accordance with an embodiment of the present invention.

Referring to both of FIG. 4A and FIG. 3D, the structure shown in FIG. 4A is similar to the structure shown in FIG. 3D, and the main difference is that the insulating layer 210 of FIG. 4A is different from the insulating layer 110 of FIG. 3D, so the description of the remaining components (i.e., the substrate 100, the first signal trace L1, the first conductive pattern P1, the first contact window H1, the second contact window H2, the third contact window H3, the light-emitting element O, and the encapsulation layer F) can refer to the foregoing embodiments shown in FIG. 3A to FIG. 3E, which is not described again. In detail, in the embodiment of FIG. 4A, the insulating layer 210 can be separated from the first substrate 100 due to the material of the insulating layer 210. The material of the insulating layer 210 may be an organic material, wherein the organic material is, for example, a polyimide resin, an epoxy resin, an acrylic resin, or other suitable materials. In the present embodiment, the insulating layer 210 may be a single-layer structure or a multilayer structure. In addition, in the present embodiment, the method of forming the insulating layer 210 may include a physical vapor deposition method or a chemical vapor deposition method.

Figure 4B:
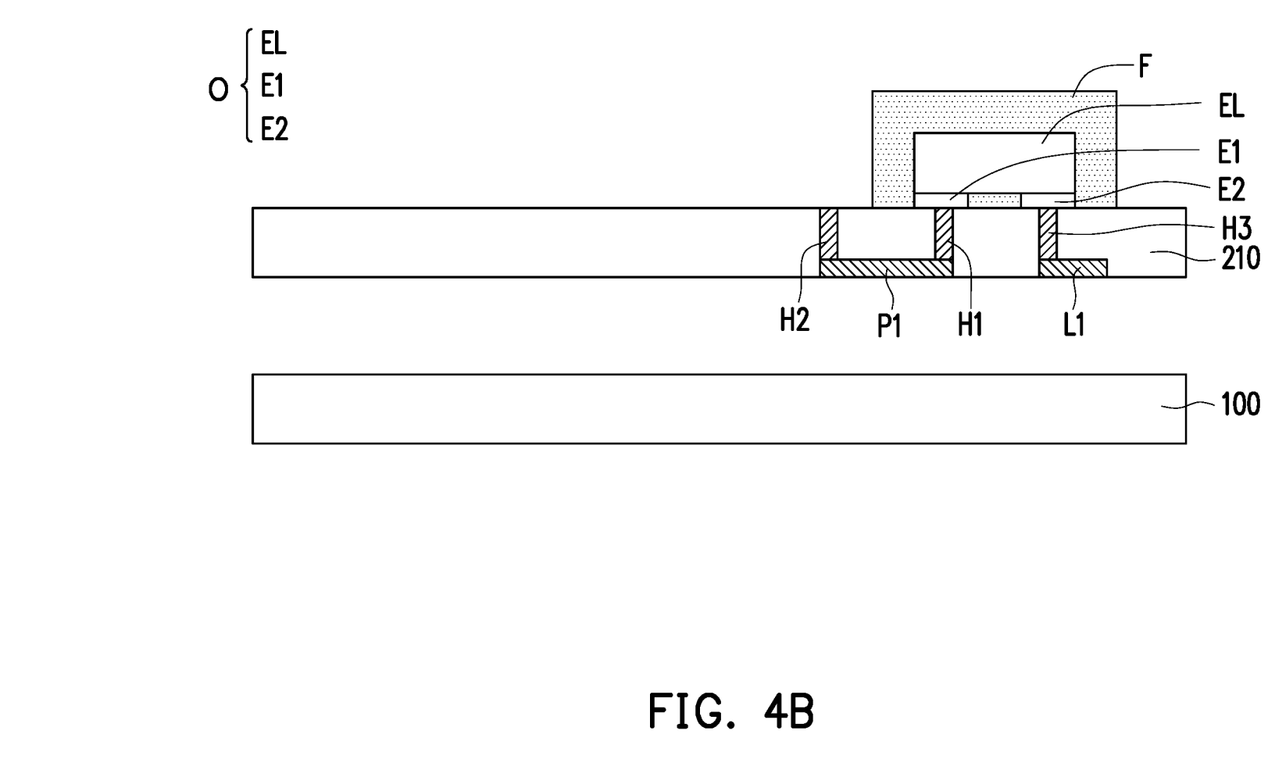

Next, referring to FIG. 4B, the insulating layer 210 is separated from the first substrate 100 to expose the first signal trace L1 and the first conductive pattern P1. In the present embodiment, the method of separating the insulating layer 210 from the first substrate 100 may include a laser lift-off process or mechanical removal. However, the invention is not limited thereto. In other embodiments, the method of separating the insulating layer 210 from the first substrate 100 may be different depending on the material of the insulating layer 210. Therefore, the present invention does not limit the method of separating the insulating layer 210 from the first substrate 100.

Figure 4C:
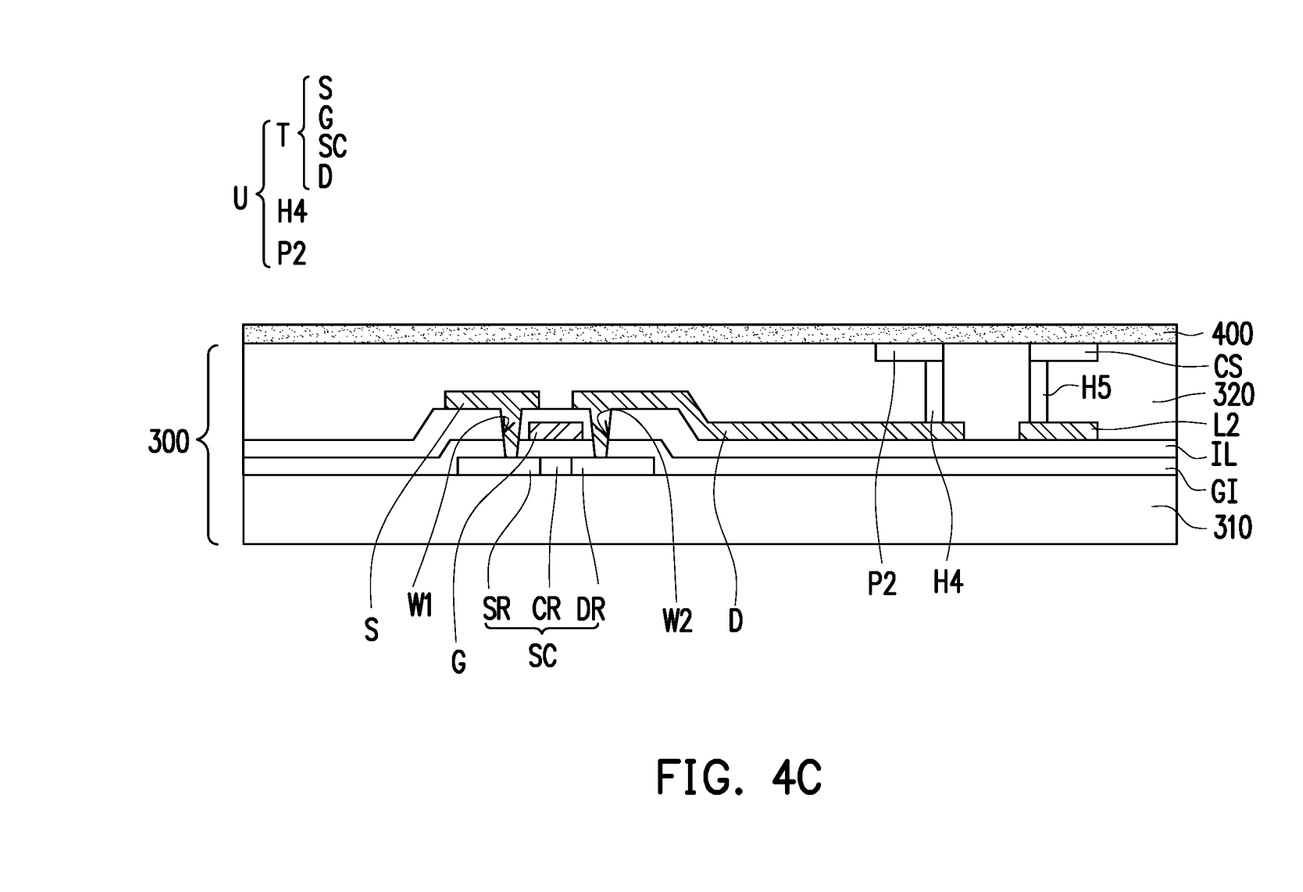

Next, referring to FIG. 4C, an element substrate 300 is provided. In the present embodiment, the element substrate 300 may include a second substrate 310, a driving unit U, a second signal trace L2, a fifth contact window H5, and a connection structure CS. According to the description of the embodiments shown in FIG. 3A to FIG. 3E, it should be understood by those of ordinary skill in the art that FIG. 4C discloses only a partial cross-sectional structure, and the element substrate 300 may actually include a plurality of driving units U, a plurality of second signal traces L2, a plurality of fifth contact windows H5, and a plurality of connection structures CS.

In the embodiment, the material of the second substrate 310 may be glass, quartz or an organic polymer. In this embodiment, the driving unit U is located on the second substrate 310 and may include a driving element T, a second conductive pattern P2, and a fourth contact window H4. The description of the driving element T has been described in detail in the above-described embodiments shown in FIG. 3A to FIG. 3E, and thus will not be described again. In the present embodiment, the second conductive pattern P2 and the fourth contact window H4 are formed in an insulating layer 320. In this embodiment, the material of the insulating layer 320 may be an inorganic material, an organic material, or other suitable materials. The inorganic material is, for example, silicon oxide, silicon nitride, silicon oxynitride, or other suitable materials. The organic material is, for example, a polyimide resin, an epoxy resin, an acrylic resin, or other suitable materials. In the present embodiment, the insulating layer 320 may be a single-layer structure or a multilayer structure. In addition, in the present embodiment, the method of forming the insulating layer 320 may include a physical vapor deposition method or a chemical vapor deposition method.

In the present embodiment, the fourth contact window H4 is in direct contact with the drain D of the driving element T, and the second conductive pattern P2 is in direct contact with the fourth contact window H4. In other words, the driving element T is electrically connected to the second conductive pattern P2 via the fourth contact window H4. In addition, in the embodiment, the conductive materials of the second conductive pattern P2 and the fourth contact window H4 may be formed in the same process step, whereby the conductive materials of the second conductive pattern P2 and the fourth contact window H4 may be made of the same material. However, the invention is not limited thereto. In other embodiments, the second conductive pattern P2 may be formed in a process step different from that for forming the fourth contact window H4. In this case, the conductive material of the second conductive pattern P2 may be different from the conductive material of the fourth contact window H4. The conductive materials of the second conductive pattern P2 and the fourth contact window H4 respectively are generally a metal material based on conductivity considerations. However, the present invention is not limited thereto. According to other embodiments, the conductive materials of the second conductive pattern P2 and the fourth contact window H4 may respectively be, for example, an alloy, a nitride of a metal material, an oxide of a metal material, an oxynitride of a metal material, a non-metallic material with conductive property, or other suitable materials.

In the embodiment, the second signal trace L2 is located on the second substrate 310. In this embodiment, the second signal trace L2 and the source S and the drain D of the driving element T may be formed in the same process step, whereby the second signal trace L2, the source S and the drain D may be made of the same material.

In the present embodiment, the fifth contact window H5 and the connection structure CS are formed in the insulating layer 320. In the present embodiment, the fifth contact window H5 is in direct contact with the second signal trace L2, and the connection structure CS is in direct contact with the fifth contact window H5. In other words, the second signal trace L2 is electrically connected to the connection structure CS via the fifth contact window H5. In addition, in the present embodiment, the conductive material of the fifth contact window H5 and the conductive material of the connection structure CS may be formed in the same process step, whereby the conductive material of the fifth contact window H5 and the conductive material of the connection structure CS may be made of the same material. However, the invention is not limited thereto. In other embodiments, the connection structure CS may be formed in a process step different from that for forming the fifth contact window H5. In this case, the conductive material of the connection structure CS may be different from the conductive material of the fifth contact window H5. Based on the conductivity considerations, the conductive material of the fifth contact window H5 and the conductive material of the connection structure CS respectively are generally a metal material. However, the present invention is not limited thereto. According to other embodiments, the conductive material of the fifth contact window H5 and the conductive material of the connection structure CS may respectively be, for example, an alloy, a nitride of a metal material, an oxide of a metal material, an oxynitride of a metal material, a non-metallic material with conductive property, or other suitable materials.

Next, referring to FIG. 4C as well, after the element substrate 300 is provided, the step of disposing a conductive adhesive layer 400 is performed. In the present embodiment, the conductive adhesive layer 400 is provided on the element substrate 300, but the present invention is not limited thereto. In other embodiments, the conductive adhesive layer 400 may be formed on the insulating layer 210. In the present embodiment, the conductive adhesive layer 400 may be, for example, an anisotropic conductive film (ACF).

Figure 4D:
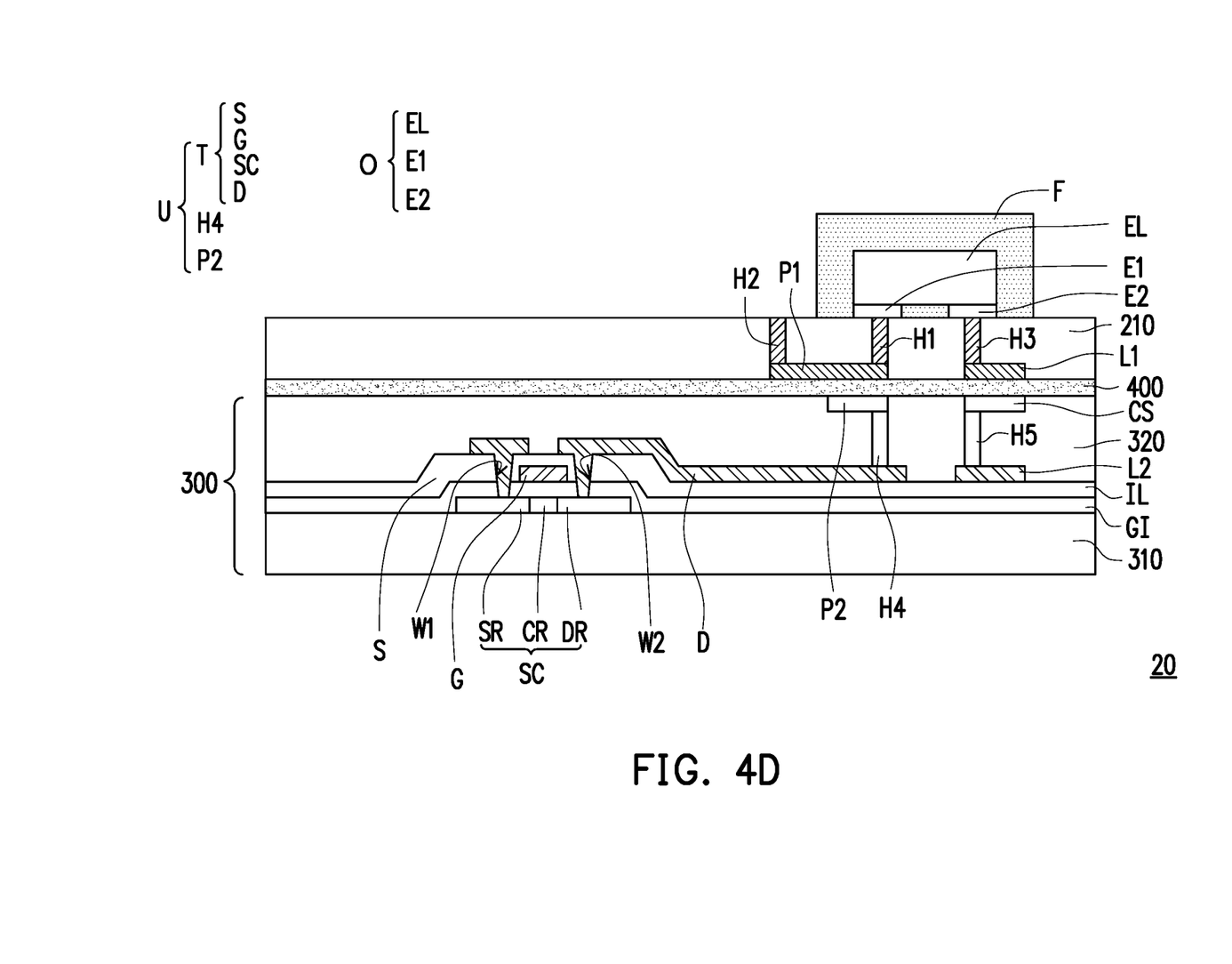

Next, referring to FIG. 4D, the insulating layer 210 is bonded to the element substrate 300 via the conductive adhesive layer 400, so that the driving unit U is electrically connected to the light-emitting element O. In detail, in the present embodiment, the second conductive pattern P2 is electrically connected to the first conductive pattern P1 via the conductive adhesive layer 400. As described above, the driving element T is electrically connected to the second conductive pattern P2 via the fourth contact window H4, and the light-emitting element O is electrically connected to the first conductive pattern P1 via the first contact window H1, so that After the insulating layer 210 is bonded to the element substrate 300, the driving element T is electrically connected to the light-emitting element O via the fourth contact window H4, the second conductive pattern P2, the first conductive pattern P1, and the first contact window H1. From another point of view, in the present embodiment, the driving unit U and the light-emitting element O are respectively located on opposite sides of the insulating layer 210.

In addition, in the present embodiment, the connection structure CS is electrically connected to the first signal trace L1 via the conductive adhesive layer 400. As described above, the second signal trace L2 is electrically connected to the connection structure CS via the fifth contact window H5, and the light-emitting element O is electrically connected to the first signal trace L1 via the third contact window H3, so that after the insulating layer 210 is bonded to the element substrate 300, the second signal trace L2 is electrically connected to the light-emitting element O via the fifth contact window H5, the connection structure CS, the first signal trace L1 and the third contact window H3. For the rest, please refer to the foregoing embodiments, and details are not described herein.

So far, the fabrication of the light-emitting device 20 of the present embodiment is substantially completed after the processes shown in FIG. 4A to FIG. 4D described above. It should be noted that the manufacturing method of the light-emitting device 20 includes the following steps of: forming a test trace TL and a first signal trace L1 on a first substrate 100 (step S10), forming a light-emitting element O electrically connected to the test trace TL and the first signal trace line L1 (step S20), performing a test procedure on the light-emitting element O via the test trace TL and the first signal trace L1 (step S30) to form an encapsulation layer F covering the light-emitting element O (step S40), and removing the test trace TL to then form a driving unit U electrically connected to the light-emitting element O (step S50), so the test procedure for confirming whether the light-emitting element O operates normally can be executed after forming the light-emitting element O and before forming the driving unit U. In this way, in the process of manufacturing the light-emitting device 20, the problem that the driving unit U is damaged during the repair procedure is eliminated, whereby the light-emitting device O having abnormality can be repaired after the test procedure is executed, and the goal of improving the yield production of the light-emitting device 20 is achieved. On the other hand, in the manufacturing method of the light-emitting device 20, since the step of forming the light-emitting element O is before the step of forming the driving unit U, the limits of the driving unit U to the environmental conditions such as temperature may not be considered in the process of forming the light-emitting element O (for example, the transfer process).

Further, in the light-emitting device 20, the insulating layer 210 is bonded to the element substrate 300 via the conductive adhesive layer 400, but the present invention is not limited thereto. In other embodiments, the conductive layer 400 may not be disposed between the insulating layer 210 and the element substrate 300 (that is, the step of disposing the conductive adhesive layer 400 may not be performed before the insulating layer 210 is bonded to the element substrate 300). In this case, the insulating layer 210 is directly connected to the element substrate 300, the second conductive pattern P2 is directly connected to the first conductive pattern P1, and the connection structure CS is directly connected to the first signal trace L1.

Further, in the light-emitting device 20, the insulating layer 210 is bonded only to one element substrate 300, but the present invention is not limited thereto. In other embodiments, the insulating layer 210 may be bonded to a plurality of element substrates stacked on each other.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a light-emitting device, comprising:
    forming a test trace and a first signal trace on a first substrate;
    forming a light-emitting element electrically connected to the test trace and the first signal trace;
    performing a test procedure on the light-emitting element via the test trace and the first signal trace;
    forming an encapsulation layer on the first substrate to cover the light-emitting element; and
    after removing the test trace, forming a driving unit electrically connected to the light-emitting element.

2. The manufacturing method of the light-emitting device of claim 1, wherein the method of forming the test trace and the first signal trace on the first substrate comprises:
    forming the first signal trace and a first conductive pattern on the first substrate;
    forming a first contact window, a second contact window, and a third contact window on the first signal trace and the first conductive pattern, wherein the first conductive pattern is electrically connected to the first contact window and the a second contact window, the first signal trace is electrically connected to the third contact window; and forming the test trace on the second contact window.

3. The manufacturing method of the light-emitting device of claim 2, wherein the light-emitting device comprises a first electrode, a second electrode, and a light-emitting structure, the light-emitting structure is electrically connected to the first electrode and the second electrode, wherein the first electrode is electrically connected to the test trace via the first contact window, the first conductive pattern and the second contact window, and the second electrode is electrically connected to the first signal trace via the third contact window.

4. The manufacturing method of the light-emitting device of claim 2, further comprising forming an insulating layer on the first substrate, after forming the first signal trace and the first conductive pattern and before forming the first contact window, the second contact window, and the third contact window.

5. The manufacturing method of the light-emitting device of claim 4, wherein the test trace is removed to expose the second contact window.

6. The manufacturing method of the light-emitting device of claim 5, wherein the driving unit is formed on the insulating layer, the driving unit comprises a driving element, and the driving element is electrically connected to the light-emitting element via the second contact window, the first conductive pattern and the first contact window.

7. The manufacturing method of the light-emitting device of claim 5, wherein after the test trace is removed and before the driving unit is formed, the method further comprises:

separating the insulating layer from the first substrate to expose the first signal trace and the first conductive pattern.

8. The manufacturing method of the light-emitting device of claim 7, wherein the method of forming the driving unit comprises:

bonding the insulating layer to an element substrate, wherein the element substrate comprises a second substrate and the driving unit on the second substrate, the driving unit comprises a driving element, and the driving element is electrically connected to the first conductive pattern.

9. The manufacturing method of the light-emitting device of claim 8, wherein before bonding the insulating layer to the element substrate, the method further comprises performing a step of disposing a conductive adhesive layer.

10. The manufacturing method of the light-emitting device of claim 8, wherein the driving unit further comprises:

a second conductive pattern electrically connected to the first conductive pattern; and a fourth contact window electrically connected to the second conductive pattern, wherein the driving element is electrically connected to the light-emitting element via the fourth contact window, the second conductive pattern, the first conductive pattern, and the first contact window.

11. The manufacturing method of the light-emitting device of claim 10, wherein the element substrate further comprises:

a connection structure electrically connected to the first signal trace;

a second signal trace electrically connected to the connection structure; and a fifth contact window electrically connected to the connection structure and the second signal trace.

12. The manufacturing method of the light-emitting device of claim 7, wherein the material of the insulating layer comprises a polyimide resin, an epoxy resin or an acrylic resin.

\* \* \* \* \*